Jan. 23, 1968 L. A. KAPLAN 3,365,672
COMMON BASE POWER AMPLIFIER
Filed Sept. 22, 1964
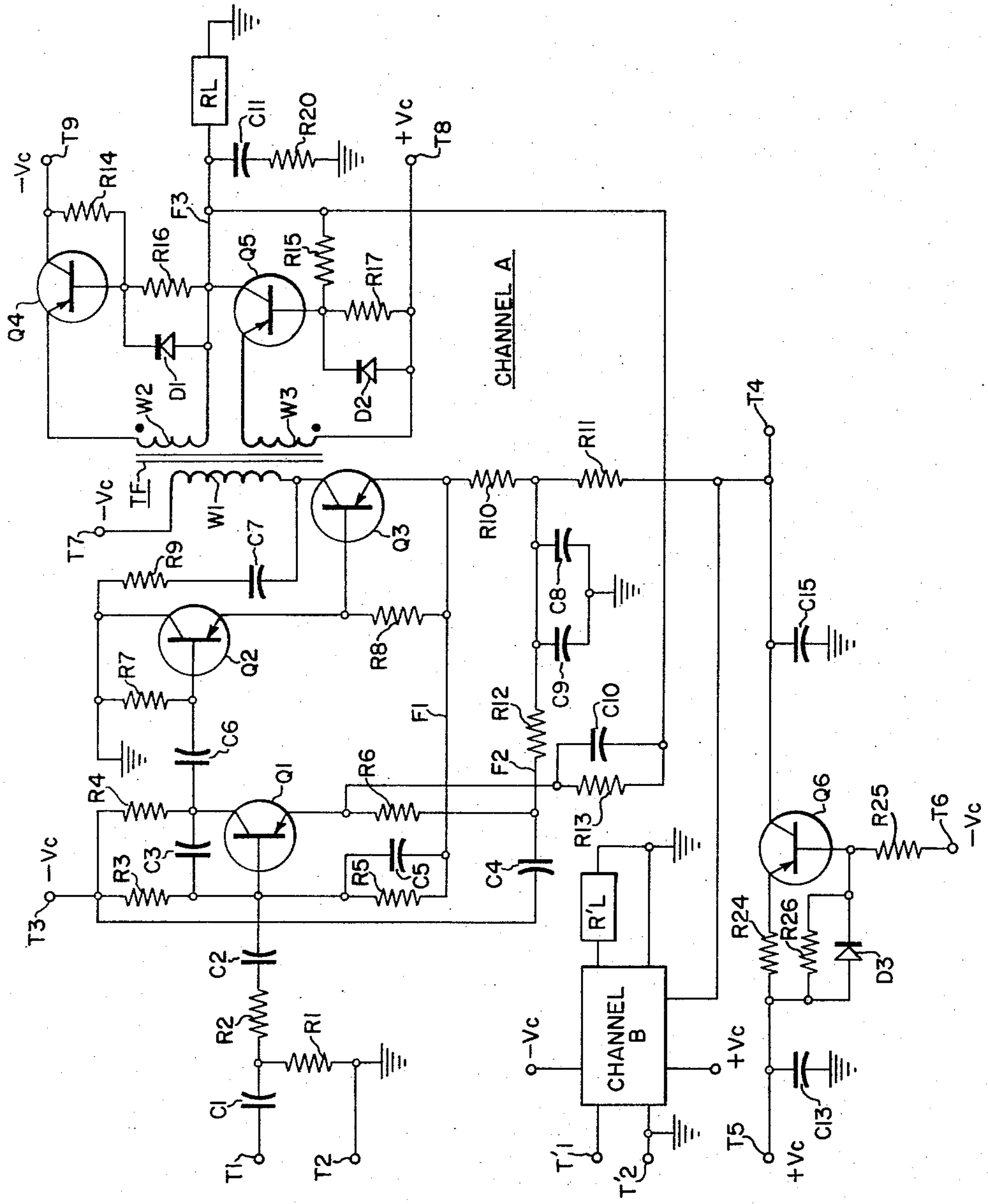
INVENTOR
Leonard A. Kaplan
BY A. Samuel Oddi United States Patent Office 3,365,672

Patented Jan. 23, 1968

3,365,672

COMMON BASE POWER AMPLIFIER

Leonard A. Kaplan, Fords, N.J., assignor to Westinghouse Electric Corporation, East Pittsburgh, Pa., a corporation of Pennsylvania Filed Sept. 22, 1964, Ser. No. 398,202
6 Claims. (Cl. 330—15)

ABSTRACT OF THE DISCLOSURE

The present disclosure relates to a power amplifier for dual channel or stereo operation in which the output stage includes a pair of transistors connected in a common base configuration providing low distortion and hum, high frequency response and high power gain. The output transistors are driven in a push-pull fashion by a transformer which is driven by a constant current source. The drive is supplied by a transistor connected in a common emitter configuration which is supplied by an emitter follower which presents a low impedance to the driver stage and with the driver stage provides an enhanced frequency response for the amplifier.

The present invention relates to power amplifiers, and more particularly to transistor power amplifiers suitable for dual channel or stereo operation.

Power amplifiers for use in high fidelity dual channel or stereo applications must meet severe requirements as to hum, distortion, power gain and frequency response. It is necessary that hum and distortion be held to very low levels while providing a flat response over a wide band width. Moreover, it is necessary that the aforementioned criteria be satisfied along with providing output signals to the speaker system at a substantial power gain. The advent of transistor high fidelity components has brought about improved performance in certain respects due to the inherent advantages of good frequency response, and operation at low noise levels. Additional advantages are realized through the elimination of some limiting components such as the output transformers. On the other hand, the use of transistor circuitry has introduced additional problems such as instability as high temperatures, difficulty in providing sufficient driving currents and impedance matching difficulties, as well as other problems typically associated with transistor circuitry.

It is, therefore, an object of the present invention to provide a new and improved transistor power amplifier.

It is a further object of the present invention to provide a transistor amplifier capable of dual channel or stereo operation and providing low hum and distortion with wide band frequency response and having a high power gain.

Broadly, the present invention provides a transistor power amplifier for dual channel or stereo operation in which the output stage includes transistors operative in the common base mode to provide low distortion and hum, high frequency response and high power gain. The output stage is driven by a constant current source to effect the above qualities. The driver stage includes a transistor operative in the common emitter mode and which is preceded by an emitter follower transistor providing a low impedance source to the driver stage and therefore accomplishing enhanced frequency response with the driver stage.

These and other objects and advantages of the present invention will become more apparent when considered in view of the following specification and drawing, in which: The single figure is a schematic-block diagram of the power amplifier of the present invention.

Referring to the figure, a schematic diagram is shown of a single channel, labeled channel A, of the power amplifier of the present invention. The other channel, channel B, is shown in block form. For dual channel or stereo operation, the channels A and B are identical being driven by a common power supply. For simplicity, however, only channel A is described herein in detail, the other channel B being identical.

The power amplifier as shown, may be broken down into its functional components according to the associated transistors. The power amplifier thus comprises: an input preamplifier stage including the transistor Q1; a predriver stage including the transistor Q2; a driver stage including the transistor Q3; and output stage including the transistors Q4 and Q5; and a filtering stage including the transistor Q6. Positive and negative biasing voltages $+Vc$ and $-Vc$ are supplied from a power supply, now shown to both channels A and B. The power supply may be any standard circuit, such as a full-wave center tapped one with the ripple voltages at $+Vc$ and $-Vc$ being at 120 cycles per second and esesntially equal and opposite for cancellation.

Input audio signals are applied to the terminals T1 and T2, the latter terminal being grounded. Between the input terminals T1 and T2 and the base electrode of the transistor Q1 is connected an attenuator circuit to attenuate the input signals a predetermined amount so as to operate with the preamplifier stage having a high gain. The attenuator circuit includes a series circuit comprising a capacitor C1, a resistor R2 and a capacitor C2, with the capacitor C1 connected to the terminal T1 and the capacitor C2 connected to the base electrode of the transistor Q1. A resistor R1 is connected between the capacitor C1 and the resistor R2 and ground. The transistor Q1 of the preamplifier stage is operative in a common emitter mode so as to supply sufficient gain to the input signals and simultaneously provide proper source impedance for the predriver stage including the transistor Q2. A biasing resistor R3 is connected between the base of the transistor Q1 and a terminal T3 to which the negative power supply voltage $-Vc$ is applied. The collector of the transistor Q1 is connected through a resistor R4 to the terminal T3 at the negative potential $-Vc$. A capacitor C3 is connected between the base and collector electrodes of the transistor Q1 in order to maintain negative feedback at extremely high frequencies. A parallel combination of a capacitor C5 and a resistor R5 have one end connected to the base of the transistor Q1 and the other end through a feedback line F1 connected to the emitter of the transistor Q3. The capacitor C5 compensates for phase deviations to maintain negative feedback at extremely high frequencies similarly to the function of the capacitor C3. A resistor R6 is connected between the emitter of the transistor Q1 and a feedback line F2. A capacitor C4 is connected in the feedback line F2 between the resistor R6 and the negative bias terminal T3 for feedback de-coupling. The output of the transistor Q1 is taken from its collector electrode and applied to the base of the predriver transistor Q2 through a coupling capacitor C6.

Together the transistor Q2 of the prediver stage and the transistor Q3 of the driver stage operate as a combined emitter follower and driver. The emitter of the emitter follower transistor Q2 is connected to the base of the driver transistor Q3. The collector of the transistor Q2 is grounded and a resistor R7 is connected between the base of the transistor Q2 and ground. The emitter of the transistor Q2 is connected through a resistor R8 to the feedback line F1, while the emitter of transistor Q3 is directly connected to the feedback line F1. By so connecting the transistors Q2 and Q3 to operate as a combined emitter follower and driver stage, a combined stage having high power gain, very broad band response and high output impedance is provided. The output impedance is further enhanced and, moreover, the distortion lowered by providing current sensed feedback through the capacitor C5 and the resistor R5 in the feedback line F1. The collector of the driven transistor Q3 is connected to a primary winding W1 of a driving transformer TF. Between the collector of the transistor Q3 and ground is connected a series circuit of a resistor R9 and a capacitor C7 which critically dampens the reactive components of the driver transformer TF to square waves. A resistor R10 is connected to the emitter of the transistor Q3 and in series with a resistor R11, whose other end is connected to a terminal T4. A resistor R12 is connected in the feedback line F2 between the resistor R6 and a junction between the resistors R10 and R11. Since the base bias resistor R5 of the transistor Q1 is directly connected to the emitter of the transistor Q3 and thus is at a less positive potential than the resistor R6 at the feedback line F2, the emitter resistor R12 in the feedback line F2 may be of a large resistance value to provide for temperature stability in the input transistor Q1.

The resistor R8 between the emitter electrodes of the transistors Q2 and Q3 allows the transistor Q2 to pass more current than just the base current of the transistor Q3. This is necessary since as the temperature varies the base current of the transistor Q3 also varies. At high temperatures the transistor Q2 could be rendered nonconductive if no other current paths were provided. Connected between the feedback line F2 and ground are a pair of capacitors C8 and C9 which provide decoupling at audio frequencies. The resistor R11, connected between the resistor R10 and the collector of the filtering transistor Q6, is selected to have a relatively high resistance value to aid the temperature stability of the transistor Q3.

The filtering circuit including the transistor Q6 operates as a high impedance element to alternating signals but, nonetheless, permits the passage of relatively large direct currents. The positive polarity power supply voltage +Vc is supplied to a terminal T5 through a current controlling resistor R24 to the emitter electrode of the transistor Q6. A filtering capacitor C13 is connected between the terminal T5 and ground. A diode D3 shunted by a resistor R26 is connected between the terminal T5 and the base of the transistor Q6. The base of the transistor Q6 is biased from a terminal T6 at the negative power supply voltage —Vc to a resistor R25 connected to the base of the transistor Q6. A filtering capacitor C15 is connected between the collector of the transistor Q6 and ground. Since the diode D3 is forward biased by the direct voltage +Vc the transistor Q6 operates in a common base mode. Thus, a very high output impedance is presented at the collector of the transistor Q6. Such a dynamic impedance attenuates alternating ripple signals appearing in the power supply voltage, but direct current may readily pass through the transistor from emitter to collector being controlled by the resistor R24. Any remaining alternating components appearing at the collector transistor Q6 are shunted to ground by the capacitor C15. For a further discussion of the filtering circuit including the transistor Q6 reference is made to copending application Ser. No. 363,722 filed Apr. 30, 1964, now abandoned, by the same inventor and assigned to the same assignee as the present application. A relatively pure positive power supply voltage is thus supplied at the terminal T4 at the collector of the transistor Q6 and is applied to the emitter of the driver transistor Q3 through the resistors R11 and R10.

The collector of the transistor Q3 is connected to the primary winding W1 of the driver transformer TF with the other end of the primary winding W1 being connected to a terminal T7 at the negative power supply voltage —Vc. The transformer TF has two secondary windings W2 and W3 wound according to the dot conventions shown. The dotted end of the winding W2 is connected to the emitter of the output transistor Q4 while the undotted end of the winding W3 is connected to the emitter of the other output transistor Q5. The undotted end of the winding W2 is connected through a parallel circuit of a diode D1 and a resistor R16 to the base of the transistor Q4. The dotted end of the winding W3 is connected to a terminal T8 at the positive power supply voltage +Vc. Between the base of the transistor Q5 and the dotted end of the winding W3 is connected a parallel combination of a diode D2 and a resistor R17. The diodes D1 and D2 in the output stage are thus forward biased. The collector of the transistor Q4 is connected to a terminal T9 at the negative power supply voltage —Vc. Between the terminal T9 and the base of the transistor Q4 is connected a resistor R14 for biasing purposes. A biasing resistor R15 is connected between the base and collector of the transistor Q5. The output stage transistors Q4 and Q5 thus are operative in a common base mode. A load RL, which may comprise a dynamic speaker, is connected between the collector of the transistor Q5 at a third feedback line F3 and ground. A capacitor C11 and resistor R20 in series combination are connected between the collector of the transistor Q5 and ground for high frequency dampening purposes.

The transistor Q3 operates as a current source to drive the primary winding W1 of the transformer TF. The secondary windings W2 and W3 thus drive the transistor Q4 and Q5 from a current source. With the transistors Q4 and Q5 operative in a common base mode and driven by a current source such as provided crossover distortion is effectively eliminated with or without forward bias being applied to the emitter-base junction of the output transistors Q4 and Q5. It should be noted that both the transistors Q4 and Q5 are forward biased in the output stages by the diodes D1 and D2. If however, forward bias were not provided in the output stage, the load seen by the driver stage Q3 would undergo large changes in impedance value around the crossover area. In particular, the load impedance seen by the driver stage Q3 will become very high during the crossover portion of the cycle. The driver transistor Q3 operative as a current source supplies the same amount of current at all times including the crossover portion of the cycle. At this time, the output current times the magnitude of the output impedance as seen by the transistor Q3 becomes very high. This voltage magnitude becomes so high that the transistor Q3 might be incapable of supplying such a voltage. If, however, the output stage transistors are slightly forward biased, the load impedance as seen by driver transistor Q3 is reduced and therefore greatly limits the collector voltage swing required. The resistor R10 connected to the emitter of the transistor Q3 makes the input impedance of the transistor Q3 appear high in comparison to the output impedance of the emitter follower transistor Q2. Under such conditions the transistor Q3 operates in a transconductance mode and thus band width enhancement is achieved.

The available power output of the amplifier at high frequency is principally limited by the leakage reactance of the driver transformer TF. The driver transformer TF also causes an increase in impedance of the output stage as seen by the driver stage including the transistor Q3. Therefore, controlling the output impedance of the output stage becomes increasingly important to the driver stage. Considering the output stage in more detail, the transistors Q4 and Q5 are respectively biased by the resistors R14 and R16 and the diode D1, and the resistors R15 and R17 and the diode D2 respectively. The diodes D1 and D2 should be germanium ones which can never provide more forward bias to the respective transistors Q4 and Q5 than required to take the transistors Q4 and Q5 out of their crossover conditions. This can take place because of the similar tracking properties of junctions fabricated of similar materials and since an actual fabrication of the circuit the transistors Q3 and Q4 and the diodes D1 and D2 would be mounted on a common heat sink. For improved characteristics, a third feedback line F3 is connected from the output of the transistors Q4 and Q5 to the emitter of the input transistor Q1 through a phase correcting circuit including the resistor R13 shunted by a capacitor C10.

The output stage transistors Q4 and Q5 are connected in series for direct current, however, are driven in opposite phase and operate in a push-pull manner for incoming signals. The input impedance to the transistors Q4 and Q5 is very low in that they are operated in a common base mode. In order to avoid loss in the transformer TF, the winding resistances of the windings W1, W2, and W3 must be kept extremely low and thus are of insufficient magnitude to significantly aid thermal stabilization. Temperature stabilization is obtained through the use of the resistors R14, R16, R15 and R17 and the diodes D1 and D2. At ambient temperatures, the transistors Q4 and Q5 are forward biased by the voltage induced in the diode D1 and the resistor R16 and the diode D2 and the resistor R16, respectively, obtained by the current passage through the resistors R14 and R15, respectively. However, as the temperature rises, the voltage drop of the junction of the germanium diodes D1 and D2 decreases. Thus, the forward bias on the output transistors is decreased to accomplish temperature stabilization.

Characteristically in the common base mode of operation in order to insure low distortion the driving stage must present a high impedance, that is, should approximate a current source. This condition is met by the driving stage Q3 as described above. Moreover, the common base configuration yields the highest frequency response of any transistor configuration since the alpha cutoff is the significant parameter. Presently known transistors have alpha cutoff frequencies in excess of 400 kilocycles. By such an output stage as herein taught the frequency response problem is eliminated.

Emitter degeneration is provided by the use of the unbypassed emitter resistor R10 which raises the output impedance of the driver transistor Q3 to simulate a current source. The transistor Q3 should be selected to have a good frequency response. The benefits of emitter degeneration are high output impedance and enhanced frequency response. To realize these benefits the transistor Q3 should be driven from a low impedance source. This is accomplished by operating the predriver transistor Q2 in the common collector mode. With such interaction between the transistors Q2 and Q3 they each complement each other. The transistor Q3 should be well heat sinked since at elevated temperature the change in transistor parameters will result in the degradation and the amount of hum reduction produced and in the reduction of the magnitude of the output impedance. The transistor Q2 should be selected to have a high frequency cutoff. It then results that the limits of frequency response are the transistor Q3 and the transformer TF. There is another advantage resulting from the connection of transistor Q2 and Q3 in that the leakage inductance of the transformer TF causes no high frequency roll-off of small signals. The leakage inductance need only be controlled at a low level to permit the collector impedance as seen by the transistor Q3 to be low enough so that the voltage swing of the collector of the transistor Q3 will not be so large in magnitude as to cause distortion at the highest frequency of operation.

The combined emitter-follower drive stage of the transistors Q2 and Q3 thus provide high power gain, very broad frequency response and a high output impedance. The common base configuration of the output stage in turn provides low distortion and broad frequency response at a substantial power gain.

Channel B, as mentioned above, is identical to channel A. In channel B, input signals are applied to a pair of input terminal T'1 and T'2, and are amplified in the channel to drive a load R'L. Input connections are shown schematically for the positive and negative power supply voltage $+Vc$ and $-Vc$ along with a connection to the terminal T4.

Although the present invention has been described with a certain degree of particularity, it should be understood that the present disclosure has been made only by way of example and that numerous changes in the details of construction and the combination and arrangement of parts and elements may be restored to without departing from the scope and the spirit of the present invention.

I claim as my invention:

1. A power amplifier operative with input signals to drive a load comprising: a predriver stage; a driver stage; a converting stage; and an output stage; said predriver stage coupled to said driver stage and including a first transistor for providing output signals at a low impedance level to said driver stage in response to said input signals, said driver stage including a second transistor connected to act as a current source, said driver stage coupled to said converting stage, said converting stage coupled to said output stage to provide push-pull outputs to said output stage in response to the constant current drive of said driver stage, and said output stage including a pair of transistors connected in a common base configuration and being driven respectively by said push-pull outputs of said converting stage to operate in a push-pull manner to drive said load, said transistors of said output stage being forward biased to reduce load impedance as seen by said driver stage.

2. A power amplifier operative with input signals to drive a load comprising: a predriver stage; a driver stage; a transforming stage; and an output stage; said predriver stage coupled to said driver stage and including a first transistor connected in an emitter follower configuration to provide output signals at a low impedance level to said driver stage in response to said input signals, said driver stage including a second transistor connected in a common emitter configuration to act as a current source, said driver stage coupled to said transforming stage, said transforming stage coupled to said output stage and providing push-pull outputs to said output stage in response to the constant current drive of said driver stage, said output stage including a pair of transistors connected in a common base configuration and being connected in series for direct current and being driven respectively by said push-pull outputs of said transforming stage to operate in a push-pull manner to drive said load, said transistors of said output stage being forward biased to reduce load impedance as seen by said driver stage 3. A power amplifier operative with input signals to drive a load, comprising: a preamplifier stage; a predriver stage; a driver stage; a transforming stage; and an output stage; said preamplifier stage coupled to said predriver stage and including a first transistor for receiving said input signals and providing amplified first output signals to said predriver stage, said predriver stage coupled to said driver stage and including a second transistor for providing second output signals at a low impedance level to said driver stage in response to said first output signals, said driver stage including a third transistor connected as a current source, said predriver and driver stage coupled together to provide high power gain broad band width response and high output impedance, said driver stage coupled to said transforming stage, said transforming stage coupled to said output stage to provide push-pull outputs to said output stage in response to the constant current drive of said driver stage, said output stage including a pair of transistors connected in a common base configuration and being connected in series for direct current and being driven respectively by said push-pull outputs of said transforming stage to operate in a push-pull manner to drive said load, said transistors of said output stage being forward biased to reduce load impedance as seen by said driver stage.

4. A power amplifier operative with input signals to drive a load, said amplifier comprising a pair of similar channels with each of said channels comprising: a predriver stage; a driver stage; a transforming stage; and an output stage; said predriver stage coupled to said driver stage and including a first transistor connected in an emitter follower configuration to provide output signals at a low impedance level to said driver stage in response to said input signals, said driver stage including a second transistor connected in a common emitter configuration to act as a current source, said driver stage coupled to said transforming stage, said transforming stage coupled to said output stage to provide push-pull outputs to said output stage in response to the constant current drive of said driver stage, said output stage including a pair of transistors connected in a common base configuration and being connected in series for direct current and being driven respectively by said push-pull outputs of said transforming means to operate in a push-pull manner to drive said load, said transistors of said output stage being forward biased to reduce load impedance as seen by said driver stage.

5. A power amplifier operative with input signals to drive a load, said amplifier comprising a pair of similar channels with each of said channels comprising: a preamplifier stage; a predriver stage; a driver stage; a transforming stage; and an output stage; said preamplifier stage coupled to said predriver stage and including a first transistor for receiving said input signals and providing amplified first output signals to said predriver stage, said predriver stage coupled to said driver stage and including a second transistor for providing second output signals at a low impedance level to said driver stage in response to said first output signals, said driver stage including a third transistor connected to act as a current source, said predriver and driver stage coupled together to provide high power gain, broad band width response and high output impedance, said driver stage coupled to said transforming stage, said transformer stage coupled to said output stage to provide push-pull output stage in response to the constant current drive of said driver stage, said output stage including a pair of transistors connected in a common base configuration and being connected in series for direct current and being driven respectively by said push-pull outputs of said transforming means to operate in a push-pull manner to drive said load, said transistors of said output stage being forward biased to reduce load impedance as seen by said driver stage.

6. A power amplifier operative with input signals to drive a load, said amplifier comprising a pair of similar channels operative with a common power supply, each of said channels comprising: a preamplifier stage; a predriver stage; a driver stage; a transforming stage; and an output stage; said preamplifier stage coupled to said predriver stage and including a first transistor connected in a common emitter configuration for receiving said input signals and providing amplified first output signals to said predriver stage, said predriver stage coupled to said driver stage and including a second transistor connected in an emitter follower configuration to provide second output signals at a low impedance level to said driver stage in response to said first output signals, said driver stage including a third transistor connected in a common emitter configuration to act as a current source, said predriver and driver stage coupled together to provide high power gain, broad band width response and high output impedance, said driver stage coupled to said transforming stage, said transformer stage coupled to said output stage to provide push-pull outputs to said output stage in response to the constant current drive of said driver stage, said output stage including a pair of transistors connected in a common base configuration and being connected in series for direct current and being driven respectively by said push-pull outputs of said transforming stage to operate in a push-pull manner to drive said load, said transistors of said output stage being forward biased to reduce load impedance as seen by said driver stage; and filtering means coupled between said power supply and said driver stages of each of said channels to supply a constant current filter and supply voltage to said driver stages of each of said channels.

References Cited

UNITED STATES PATENTS 3,233,184 2/1966 Wheatley ------------ 330—15

ROY LAKE, *Primary Examiner.*

E. C. FOLSOM, *Assistant Examiner.*